United States Patent
Zhao et al.

(10) Patent No.: US 11,552,567 B2
(45) Date of Patent: Jan. 10, 2023

(54) SINGLE-INDUCTOR MULTIPLE OUTPUT (SIMO) SWITCHING POWER SUPPLY HAVING OFFSET COMMON-MODE VOLTAGE FOR OPERATING A CLASS-D AUDIO AMPLIFIER

(71) Applicant: CIRRUS LOGIC INTERNATIONAL SEMICONDUCTOR LTD., Edinburgh (GB)

(72) Inventors: Xin Zhao, Austin, TX (US); Jun Yan, Austin, TX (US); Xiaofan Fei, Austin, TX (US); Mark May, Austin, TX (US); John L. Melanson, Austin, TX (US)

(73) Assignee: CIRRUS LOGIC, INC, Austin, TX (US)

( * ) Notice: Subject to any disclaimer, the term of this patent is extended or adjusted under 35 U.S.C. 154(b) by 125 days.

(21) Appl. No.: 17/218,992

(22) Filed: Mar. 31, 2021

(65) Prior Publication Data

US 2022/0329155 A1   Oct. 13, 2022

(51) Int. Cl.
*H02M 3/158* (2006.01)
*H03F 3/217* (2006.01)
*H02M 1/00* (2006.01)

(52) U.S. Cl.
CPC .......... *H02M 3/158* (2013.01); *H02M 1/009* (2021.05); *H03F 3/2175* (2013.01)

(58) Field of Classification Search
CPC .. H02M 1/8009; H02M 1/0087; H02M 3/158; H02M 3/1582; H02M 3/1584; H02M 3/156; H02M 3/157; H03F 3/2175
See application file for complete search history.

(56) References Cited

U.S. PATENT DOCUMENTS

| | | | |
|---|---|---|---|
| 5,617,015 | A | 4/1997 | Goder et al. |
| 6,075,295 | A | 6/2000 | Li |
| 6,222,352 | B1 | 4/2001 | Lenk |
| 6,437,545 | B2 | 8/2002 | Sluijs |
| 6,900,620 | B2 | 5/2005 | Nishimori et al. |

(Continued)

OTHER PUBLICATIONS

Patra, et al., "Control scheme for reduced cross-regulation in single-inductor multiple-output DC-DC converters", IEEE Trans. Ind. Electron., vol. 60, No. 11, pp. 5095-5104, Nov. 2013.

(Continued)

*Primary Examiner* — Nguyen Tran
(74) *Attorney, Agent, or Firm* — Andrew M. Harris; Mitch Harris, Atty at Law, LLC

(57) ABSTRACT

A single-inductor multiple output (SIMO) switched-power DC-DC converter for a class-D amplifier provides outputs that are symmetric about a common-mode input voltage of the amplifier, while remaining asymmetric about a return terminal of the amplifier and switching converter. The DC-DC converter includes an inductive element, a switching circuit that energizes the inductive element from an input source, and a control circuit that controls the switching circuit. The control circuit may have multiple switching modes, and in one of the multiple switching modes, the switching circuit may couple the inductive element between outputs of the converter so that stored energy produces a differential change between the voltages of the outputs. The control circuit may implement a first control loop that maintains a common mode voltage of the pair of outputs at a predetermined voltage independent of the individual voltages of the pair of outputs.

28 Claims, 10 Drawing Sheets

(56) References Cited

U.S. PATENT DOCUMENTS

| | | |
|---|---|---|
| 6,977,447 B2 | 12/2005 | May |
| 7,176,661 B2 | 2/2007 | Kranz |
| 7,432,614 B2 | 10/2008 | Ma et al. |
| 8,049,472 B2 | 11/2011 | Easwaran et al. |
| 8,564,155 B2 | 10/2013 | Wibben |
| 8,624,429 B2 | 1/2014 | Jing et al. |
| 8,773,088 B2 | 7/2014 | Menegoli et al. |
| 8,975,879 B2 | 3/2015 | Xu et al. |
| 9,118,246 B2 | 8/2015 | Buthker |
| 9,312,771 B2 | 4/2016 | Ouyang |
| 10,505,454 B2 | 12/2019 | Zhao et al. |
| 2006/0220622 A1 | 10/2006 | Yamanaka et al. |
| 2008/0231115 A1 | 9/2008 | Cho et al. |
| 2011/0068757 A1* | 3/2011 | Xu ................. H02M 3/158 323/271 |
| 2011/0187189 A1 | 8/2011 | Moussaoui et al. |
| 2015/0326126 A1* | 11/2015 | Maru ............... H02M 3/1582 323/271 |
| 2021/0408908 A1* | 12/2021 | Lu .................. H02M 3/158 |

OTHER PUBLICATIONS

Dasika, et al., "Multivariable Control of Single-Inductor Dual-Output Buck Converters", Power Electronics, IEEE Transactions on Power Electronics, pp. 2061-2070 vol. 29, Issue: 4, Apr. 2014.

Le, et al., "A Single-Inductor Switching DC-DC Converter with 5 Outputs and Ordered Power-Distributive Control", IEEE Int. Solid-State Circuits Conf., pp. 534-620, 2007.

Bonizzoni, et al., "A 200mA 93% Peak Efficiency Single-Inductor Dual Output DC-DC Buck Converter", IEEE International Solid-State Circuits Conf. (ISSCC) Dig. Tech. Papers, pp. 526-619, Feb. 2007.

Lee, et al., "Minimized Transient and Steady-State Cross Regulation in 55-nm CMOS Single-Inductor Dual Output (SIDO) Step-Down DC-DC Converter", IEEE Journal of Solid-State Circuits, pp. 2488-2499 vol. 16, Issue: 11, Nov. 2011.

Xu, et al., "A dual-mode single-inductor dual-output switching converter with small ripple," IEEE Trans Power Electronics, vol. 25, No. 3, pp. 614-623, Mar. 2010.

Belloni, et al., "A 4-Output Single-Inductor DC-DC Buck Converter with Self-Boosted Switch Driver and 1.2A Total Output Current" to appear in 2008 IEEE International Solid-State Circuits Conf. (ISSCC) Die. Tech. Papers.

Trevisan, et al., "Digital Control of Single-Inductor Multiple-Output Step-Down DC-DC Converter in CCM" in IEEE Trans. Ind. Electron., vol. 55, No. 9, pp. 3476-3483, Sep. 2008.

Belloni, et al., "On the design of single-inductor multiple-output DC-DC buck converters", IEEE Int. Symp. Circuits and Systems, pp. 3049-3052, May 2008.

* cited by examiner

SINGLE-INDUCTOR MULTIPLE OUTPUT (SIMO) SWITCHING POWER SUPPLY HAVING OFFSET COMMON-MODE VOLTAGE FOR OPERATING A CLASS-D AUDIO AMPLIFIER

BACKGROUND

1. Field of Disclosure

The field of representative embodiments of this disclosure relates to a single-inductor multiple output (SIMO) power supply and SIMO power supplies having an asymmetric output voltage that provide asymmetric power supply voltage to class-D audio amplifiers or haptic drivers.

2. Background

Audio amplifiers, and other amplifiers such as those for driving haptic feedback devices are frequently implemented in integrated circuits (ICs) as class-D type amplifiers. The power supplies for the audio amplifiers in ICs are typically single-ended, with the load connected to the return terminal, e.g., a ground terminal and with the common-mode voltage of the output at the mid-point voltage of the power supply output and the return terminal. Alternatively, in some analog IC applications, the power supply provides positive and negative output voltages that are symmetric about a return terminal voltage, e.g., ground.

However, when operating such an audio amplifier from pulse-width modulated logic outputs, or other logic outputs representing a high-frequency single-bit sampling of the input signal, e.g., constant-edge modulated (CEM) signals or pulse-position modulated (PPM) signals, the common-mode voltage at the input of the amplifier is generally not symmetric about the power supply return terminal voltage, but is rather a midpoint of the voltage swing of the logic signals provided at the input terminals of the class-D amplifier. In order to accommodate such a difference between the common-mode voltages at the input and output of the amplifier, the inputs must either be AC-coupled (capacitively coupled) or an offset must be introduced within the amplifier and properly calibrated to eliminate the common-mode offset of the input terminals of the amplifier from appearing at the outputs of the amplifier. The common-mode voltage of the output terminals of the amplifier will typically vary as the output amplitude of the amplified signal varies, generating audible artifacts, and may also generate "pop" when enabled or disabled and during power-up/power-down.

Multiple output power supplies may be used to provide output voltages that are not symmetric, but generally require multiple output filters, e.g., the power supplies are implemented as individual output boost and/or buck converters with individual inductors. However, the addition of multiple inductors in an integrated circuit application requires additional terminals and increases circuit complexity and area.

Therefore, it would be advantageous to provide an amplifier output supply with common-mode voltage equal to the common-mode voltage of the amplifier input terminals, despite changes in the voltage difference between the positive terminal and negative terminal of the amplifier output stage power supply when the amplifier operates at different signal amplitude levels.

SUMMARY

Improved class-D amplifier operation with a power supply output midpoint voltage maintained equal to the input common-mode output voltage of the amplifier is accomplished in single-inductor multiple output (SIMO) switched-power DC-DC converter circuits, class-D amplifiers incorporating the switched-power DC-DC converter circuits, and integrated circuits including Class-D amplifiers, switched-power DC-DC converter circuits, and their methods of operation.

In some embodiments, the switched-power DC-DC converter circuit includes an input terminal and a return terminal for receiving an input voltage of the switched-power DC-DC converter circuit, a pair of outputs of the DC-DC converter for providing a differential output voltage of the DC-DC converter, an inductive element for coupling the input of the switched-power DC-DC converter circuit to the pair of outputs of the switched-power DC-DC converter circuit and having at least one winding, a switching circuit for controlling energizing of the at least one winding of the inductive element from the input of the switched-power DC-DC converter circuit and transfer of energy from the at least one winding of the inductive element to the pair of outputs of the DC-DC converter, and a control circuit for controlling switching of the switching circuit to supply output current to each of the pair of outputs of the switched-power DC-DC converter circuit. The control circuit may implement a first control loop that maintains a common mode voltage of the pair of outputs of the DC-DC converter at a predetermined voltage independent of the individual voltages of the pair of outputs of the switched-power DC-DC converter.

In some embodiments, the switched-power DC-DC converter circuit includes an inductive element for coupling an input of the switched-power DC-DC converter circuit to multiple outputs, a switching circuit that controls energizing of the at least one winding of the inductive element from an input voltage source connected to the input of the switched-power DC-DC converter circuit, and a control circuit that controls switching of the switching circuit to supply output current to each of the plurality of outputs of the switched-power DC-DC converter circuit. The control circuit may have multiple switching modes, and in at least one of the multiple switching modes, the switching circuit couples the inductive element between at least two of the plurality of outputs of the switched-power DC-DC converter circuit so that energy stored in the inductive element produces a differential change between corresponding voltages of the at least two of the plurality of outputs of the switched-power DC-DC converter circuit.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses circuits and integrated circuits that include improved single-inductor multiple output (SIMO) switched-power DC-DC converters for operating Class-D amplifier circuits, and their methods of operation. The midpoint of the output voltages of the SIMO power supplies may be offset from the common-mode voltage of the Class-D amplifier inputs so that the Class-D amplifier may be operated from input signals such as logic signals that have a common-mode voltage corresponding to a midpoint of the logical signal swing and that may vary substantially enough to generate audible artifacts in traditional amplifier/power-supply combinations, in which the midpoint of the power supply has a variable offset from the common-mode voltage of the class-D amplifier inputs. The control circuit that operates the switching circuits of the DC-DC converter may implement a first control loop that maintains a common mode voltage of the pair of outputs of the DC-DC converter at a predetermined voltage independent of the individual voltages of the pair of outputs of the switched-power DC-DC converter. The control circuit may have multiple switching modes, and in at least one of the multiple switching modes, the switching circuit couples the inductive element between at least two of the plurality of outputs of the switched-power DC-DC converter circuit so that energy stored in the inductive element produces a differential change between corresponding voltages of the at least two of the plurality of outputs of the switched-power DC-DC converter circuit.

Figure 1:
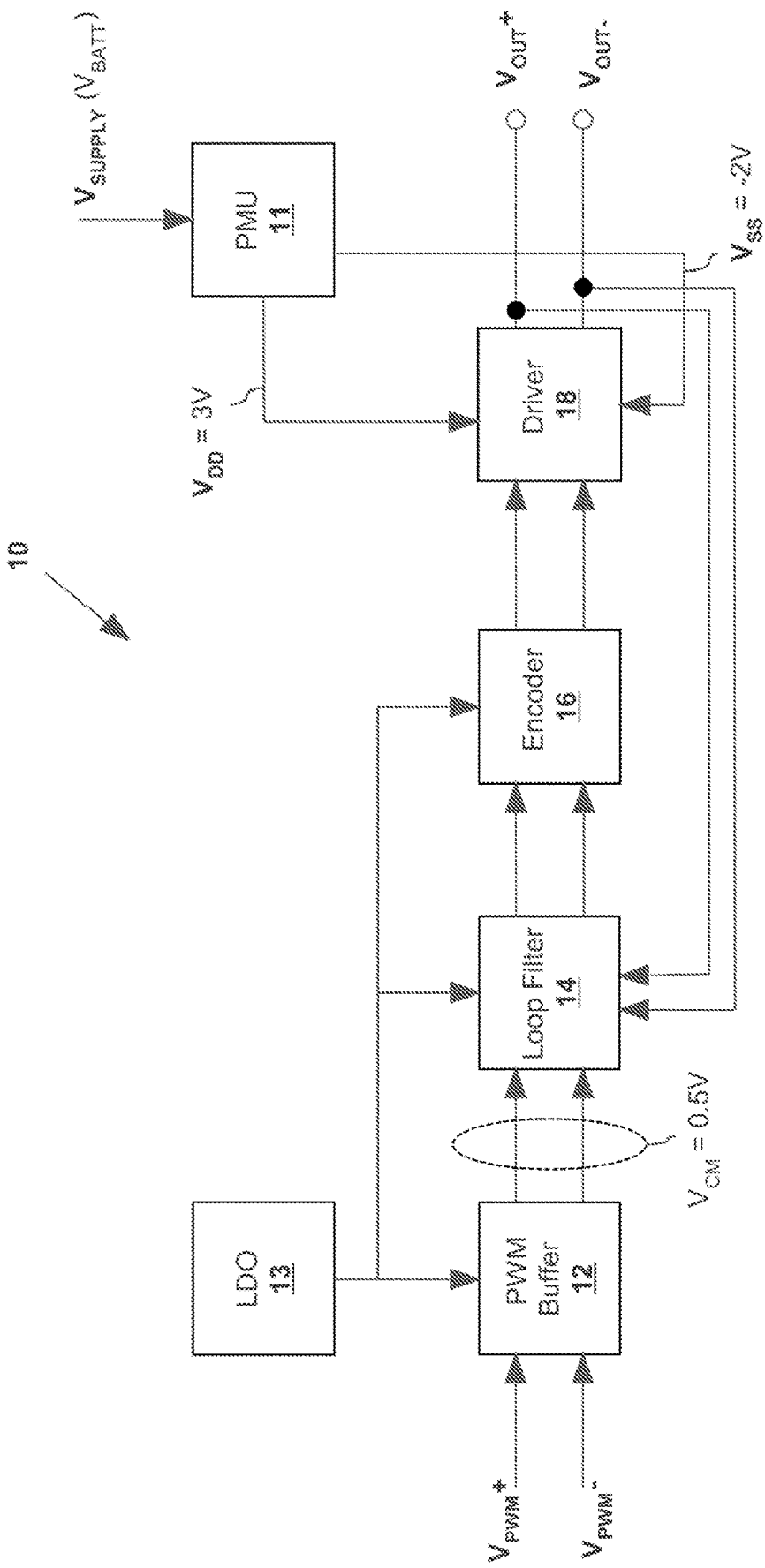
FIG. 1 is a block diagram showing an example class-D amplifier 10, in accordance with an embodiment of the disclosure.

Referring now to FIG. 1, an example class-D amplifier 10 is shown, in accordance with an embodiment of the disclosure. A pulse-width modulated (PWM) power driver circuit 18 provides a differential pair of power output audio or haptic driver signals $V_{OUT+}$, $V_{OUT-}$ for driving a transducer load (not shown), which may be a speaker, earspeakers, earphones or a haptic device. A power management unit (PMU) 11 provides the power supply voltages $V_{DD}$, $V_{SS}$ that form a power supply voltage source for driver 18, which in the depicted embodiment, are asymmetric with respect to ground, i.e., the example voltages are $V_{DD}$=3V and $V_{SS}$=−2V, therefore the common-mode output voltage of the output of driver 18 is 0.5V. By operating driver 18 with an offset of 0.5V, the feedback signals from the output of Driver 18 are made compatible with the common-mode voltage $V_{CM}$ at the inputs of a loop filter 14 that provides the input to an encoder 16 (e.g., a quantizer) that in turn, provides the input drive signals to Driver 18. The result permits a lower operating voltage for loop filter 14 and makes the input compatible with the 0V to 1V logic output swing of a PWM buffer 12 that receives input signals that are pulse-width modulated representation of the audio (or haptic) signal to be reproduced by a differential pair of power output audio or haptic driver signals $V_{OUT+}$, $V_{OUT-}$ provided by Driver 18. A low dropout (LDO) power supply 13 supplies operating current to PWM buffer 12 and loop filter 14. Minimizing operating voltage for loop filter 14 provides energy savings, as loop filter 14, at least for audio signal implementations, is a low-noise block requiring relatively high operating current levels in order to provide adequate signal-to-noise ratio (SNR) of example class-D amplifier 10.

Figure 2:
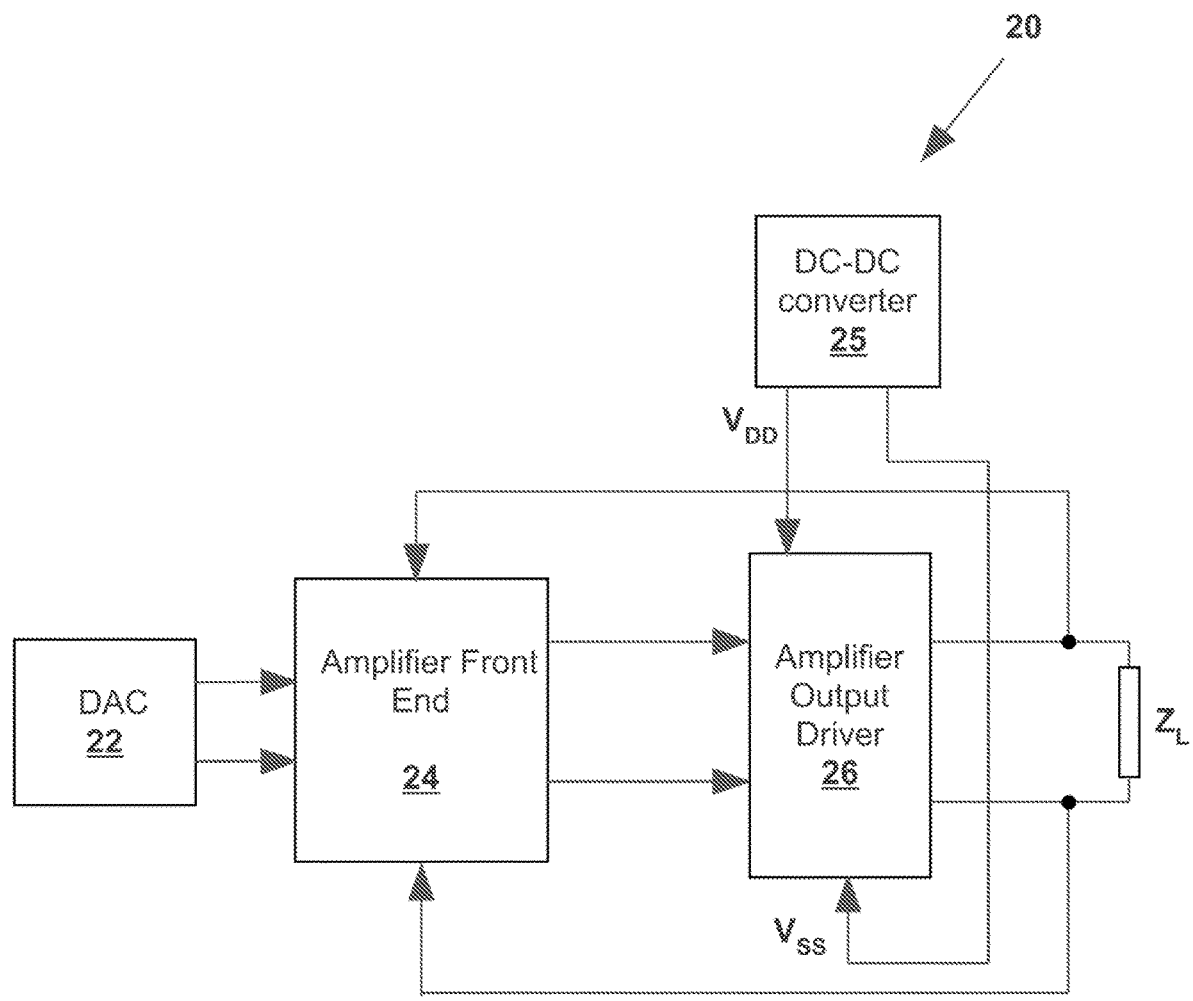
FIG. 2 is a block diagram of an example audio output system 20, in accordance with an embodiment of the disclosure.

Referring to FIG. 2, a block diagram of an example audio output system 20 is shown, in accordance with an embodiment of the disclosure. Example audio output system 20 is a generalized example audio system, in which a digital-to-analog converter (DAC) 22 provides a source of audio information in the form of a differential pair of outputs to an amplifier front end 24 that provides drive signals to an amplifier output driver 26, which is a differential class-D driver stage, e.g., a pulse-width modulated, constant edge modulated (CEM) or pulse position modulated (PPM) output stage. Amplifier output driver 26 provides a differential switched output pair of signals across a load $Z_L$, which as mentioned above may be a speaker, earspeakers, earphones, haptic device, or the like. A DC-DC converter 25 provides power supply voltages $V_{DD}$, $V_{SS}$, which, as described above, are asymmetric with respect to a return terminal input of DC-DC converter 25, as will be described in further detail below, but are symmetric with respect to the common-mode voltage at which amplifier front-end 24 and DAC 22 operate.

Figure 3A:
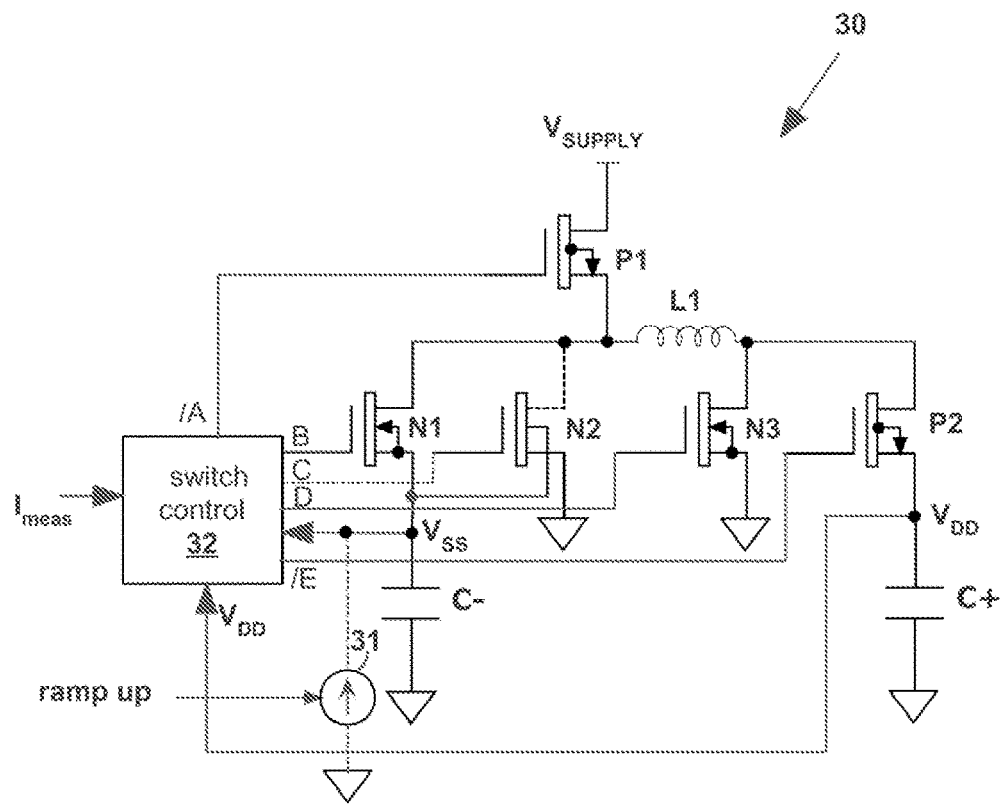
FIG. 3A is a simplified schematic diagram showing an example single-inductor multiple-output (SIMO) switched-power DC-DC converter circuit 30, in accordance with an embodiment of the disclosure.

Referring to FIG. 3A, a simplified schematic diagram of an example single-inductor multiple-output (SIMO) switched-power DC-DC converter circuit 30 is shown, in accordance with an embodiment of the disclosure. SIMO DC-DC converter circuit 30 may be used to implement DC-DC converter 25 in example audio output system 20 of FIG. 2, and requires only a single inductor L1 to provide the asymmetric power supply voltage $V_{DD}$, $V_{SS}$ that are asymmetric with respect to ground, which is the return potential associated with a power supply input voltage $V_{SUPPLY}$. A pair of filter capacitors C+ and C− filter and hold charge to maintain power supply voltages $V_{DD}$, $V_{SS}$, which is replenished by the operation of a switch control block 32 that controls a set of switching transistors P1, P2, N1, N2 and N3 that operate as a switching circuit to transfer energy from the input ($V_{SUPPLY}$, ground) of SIMO DC-DC converter circuit 30 to filter capacitors C+ and C−. Switching transistor N2 is optional in the depicted embodiment, and may be required only if certain switching modes are employed by SIMO DC-DC converter circuit 30 in accordance with various embodiments of the disclosure, as described in more detail below. Switch control block 32 asserts switch control signals /A, B, C, D and /E to activate corresponding switching transistors P1, N1, N2, N3 and P2, respectively, according to the switching modes and a measured current input $I_{meas}$ that indicates the charging current provided to inductor L1. The symbol "/" indicates that the sense of switch control signals /A and /E are inverted with respect to switch control signals B, C and D due to switching transistors P1 and P2 being P-channel devices and switching transistors N1, N2 and N3 being N-channel devices, since control signals /A, B, C, D and /E are directly connected to gates of corresponding switching transistors P1, N1, N2, N3 and P2, respectively. Measured current input $I_{meas}$ may be provided by integrating/low-pass filtering the voltage waveform across inductor L1, or by providing a sense winding on inductor L1 and appropriate measurement circuitry. Other current sensing techniques may alternatively be employed, including indirect or direct measurement of the drain current of transistor P1 or another transistor during the charging phase or discharging phase. Either the peak current or the valley current may be sampled and used for the measurement so that constant-on-time valley current control or constant-off-time peak current control may be implemented by switch control block 32. A current source 31 may be provided and activated by a control signal ramp_up during startup of SIMO DC-DC converter circuit 30 to draw current from ground to charge capacitor C− until power supply voltage $V_{DD}$ is greater than the value of power supply input voltage $V_{SUPPLY}$ for normal operation, at which time control signal ramp_up is de-asserted. Switch control block 32 may operate in a start-up mode that controls switching transistors P1, N1, N2, N3 and P2 to match a relative rate of decrease of power supply voltage $V_{SS}$ to the relative rate of rise of power supply voltage $V_{SS}$ so that power supply voltages $V_{DD}$, $V_{SS}$ remain symmetric about a specified common-mode voltage associated with an amplifier to which SIMO DC-DC converter circuit 30 supplies power. In other terms, the rate of rise the magnitudes of power supply voltages $V_{DD}$, $V_{SS}$ as a percentage of their maximum values are held constant during ramp-up/start-up.

Figure 3B:
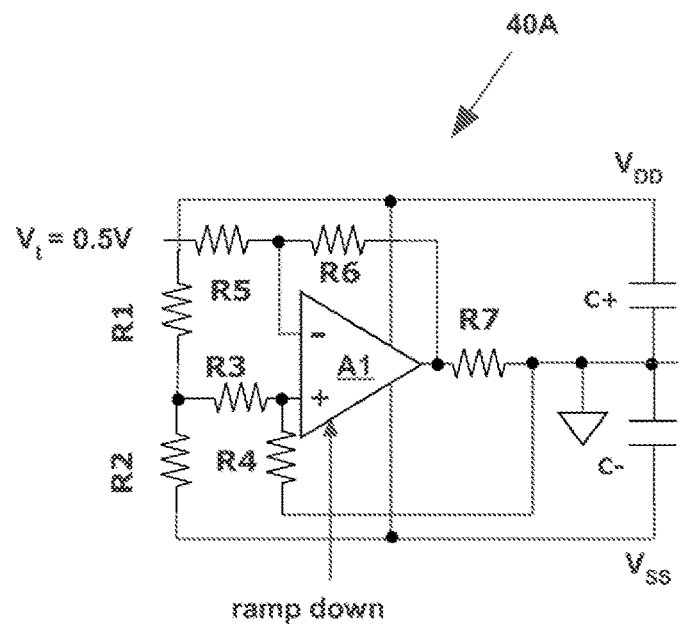
FIG. 3B and FIG. 3C are schematic diagrams showing example ramp down circuits 40A and 40B, respectively, that may be incorporated in SIMO switched-power DC-DC converter circuit 30, in accordance with embodiments of the disclosure.

Referring to FIG. 3B, a schematic diagram of an example ramp-down circuit 40A that may be used in SIMO switched-power DC-DC converter circuit 30 is shown, in accordance with an embodiment of the disclosure. When a control signal ramp_down is asserted, operational amplifier A1, is enabled, which, in a manner similar to that described above with respect to ramp-down circuit 40A, will drive current through a resistor R7 into the return node (ground), as long as the mid-point voltage provided by the resistive voltage divider implemented by resistors R1 and R2 differs from a reference voltage $V_r$, which in the example embodiment is 0.5V. Resistors R3, R4, R5 and R6 set the voltage gain of ramp down circuit 40B, which controls the rate at which ramp down circuit 40B reacts to differences between the midpoint voltage and reference voltage $V_r$.

Figure 3C:
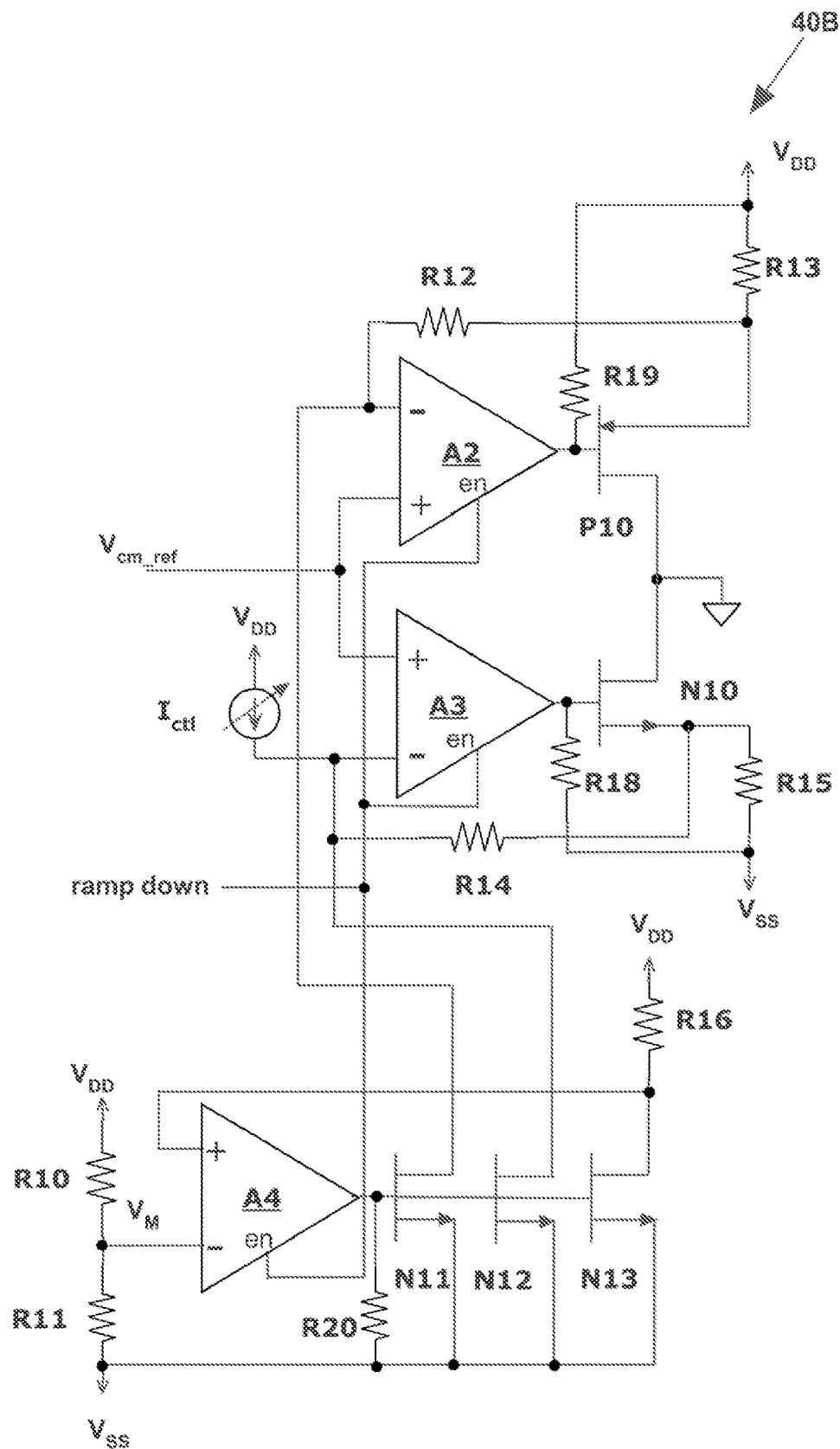

Referring to FIG. 3C, a schematic diagram of another example ramp-down circuit 40B that may be used in SIMO switched-power DC-DC converter circuit 30 is shown, in accordance with an embodiment of the disclosure. When a control signal ramp_down is asserted, for example when disabling SIMO DC-DC converter circuit 30, or when a power-down event is detected, ramp-down circuit 40B is enabled by enabling operational amplifiers A2, A3 and A4 that provide a transconductance function operated by a voltage corresponding to a mid-point voltage $V_M$ between power supply voltages $V_{DD}$, $V_{SS}$, generated by a resistive voltage divider implemented by a pair of resistors R10, R11 of equal resistance. A current $I_{MIRROR}$ is generated through a current mirror formed by transistors N11, N12 and N13 that is equal to the difference between power supply voltage $V_{DD}$ and midpoint voltage $V_M$ divided by the resistance of resistor R16:

$$I_{MIRROR} = \frac{V_{DD} - V_M}{R} = \frac{V_{DD} - \left(\frac{V_{DD} + V_{SS}}{2}\right)}{R} = \frac{V_{DD} - V_{SS}}{2R}.$$

Therefore, current $I_{MIRROR}$ is independent of the midpoint voltage and depends on the magnitude of the total power supply output voltage $V_{DD}-V_{SS}$. Since transistor N13 conducts current $I_{MIRROR}$, transistor N11 will also conduct current $I_{MIRROR}$ through the series combination of resistors R13 and R12 and transistor N12 will conduct current a $I_{MIRROR}-I_{CTL}$ through the series combination of resistors R15 and R14, where $I_{CTL}$ is the current provided by a current source Ictl. The series combination of resistors R13 and R12 and the series combination of resistors R15 and R14 have the same resistance R as resistor R16, so that the voltage at the inverting summing node of amplifier A2 is at midpoint voltage $V_M$ and the voltage at the inverting summing node of amplifier A3 is at $V_{SS}+R(I_{MIRROR}-I_{CTL})=V_M-RI_{CTL}$.

Operational amplifiers A2 and A3, along with output driver transistors P10 and N10 provide a buffered output that drives the ground node by draining current from either the terminal that provides power supply voltage $V_{DD}$ or the terminal that provides power supply voltage $V_{SS}$, depending on whether midpoint voltage $V_M$ is greater than, or less than common mode voltage reference Vcm_ref. Output driver transistors P10 and N10 are off if adjustment of power supply voltages $V_{DD}$ and $V_{SS}$ is not needed, i.e., if midpoint voltage $V_M$ is equal to a common mode voltage reference Vcm_ref that represents the input common mode voltage of class-D amplifier 20 of FIG. 2. If midpoint voltage $V_M$ is greater than common mode voltage reference Vcm_ref, the output of amplifier A2 is lowered, turning on transistor P10 to drain current from the terminal that supplies power supply voltage $V_{DD}$ to lower the voltage of the terminal that provides power supply voltage $V_{DD}$. If the voltage $V_M-RI_{CTL}$ is less than common mode voltage reference Vcm_ref, the output of amplifier A3 is raised, turning on transistor N10 to drain current from ground into the terminal that supplies power supply voltage $V_{SS}$ to raise the voltage of the terminal that provides power supply voltage $V_{SS}$. The above action provides that the magnitude of the voltages across capacitors C+ and C− decay at the same rate, maintaining the mid-point of power supply voltages $V_{DD}$, $V_{SS}$ at the common-mode voltage of class-D amplifier 20. Any difference between the magnitude of the voltages across capacitors C+ and C− will cause current injection into the ground return node to which the output of ramp-down circuit 40B is connected, which will correct any asymmetry as power supply voltages $V_{DD}$, $V_{SS}$ decay. Before ramp down and prior to restarting the power supply, amplifiers A2, A3 and A4 are disabled by de-asserting control signal ramp down. Resistors R18 and R19 will then control the gate voltages of transistors N10, P10 to maintain transistors N10, P10 in an off state, and resistor R20 ensures that none of transistors N11, N12 and N13 conduct, conserving power that would otherwise continue to be consumed by the current mirror.

Referring now to FIGS. 4A-4F pictorial diagrams depicting example switching cycles that may be used various switching modes in example SIMO switched-power DC-DC converter circuit 30 of FIG. 3, are shown in accordance with various embodiments of the disclosure. The example switching cycles shown in FIGS. 4A-4F are not limiting, and other switching cycles might be employed to implement different modes of operation in switching power converters in accordance with other embodiments of the disclosure and not all of the depicted switching cycles are required by the embodiments of the disclosure. The left side of each of FIGS. 4A-4F depicts a charging phase in which energy is transferred from the input ($V_{SUPPLY}$, ground) of SIMO DC-DC converter circuit 30 to inductor L1 as stored magnetic energy, and the right side of each of FIGS. 4A-4F shows a discharge phase, in which magnetic energy stored in inductor L1 is transferred to one or both of filter capacitors C+ and C−. However, some of the depicted cycles may simultaneously store energy in inductor L1 and transfer energy to one of filter capacitors C+ and C− under certain conditions, depending on the operation of switch control block 32 and the level of voltage across filter capacitors C+ and C−.

Figure 4A:
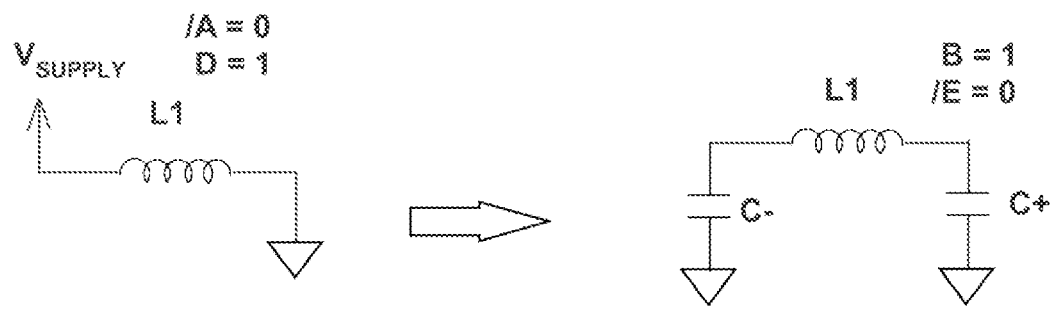
FIGS. 4A-4F are pictorial diagrams depicting example switching modes that may be used in example SIMO switched-power DC-DC converter circuit 30 of FIG. 3A.

FIG. 4A shows a pair of switching cycles implementing a "differential dump" or "differential boost" cycle that may be used to provide charge to both of filter capacitors C+ and C−, as may be performed responsive to an indication that both power supply voltages $V_{DD}$, $V_{SS}$ have magnitudes lower than their target threshold voltages, i.e., the differential between power supply voltages $V_{DD}$, $V_{SS}$ has decreased below a target value and may be used while the common mode voltage $V_{CM}$ is within tolerance. Or, as described in the multiple control loop implementation described below, the switching cycle depicted in FIG. 4A may be to restore the differential between power supply voltages $V_{DD}$, $V_{SS}$ independent of the common-mode voltage, while other power supply switching cycles as described below are used to control the common-mode voltage by adjusting either power supply voltage $V_{DD}$ or power supply voltage $V_{SS}$ individually.

Figure 4B:
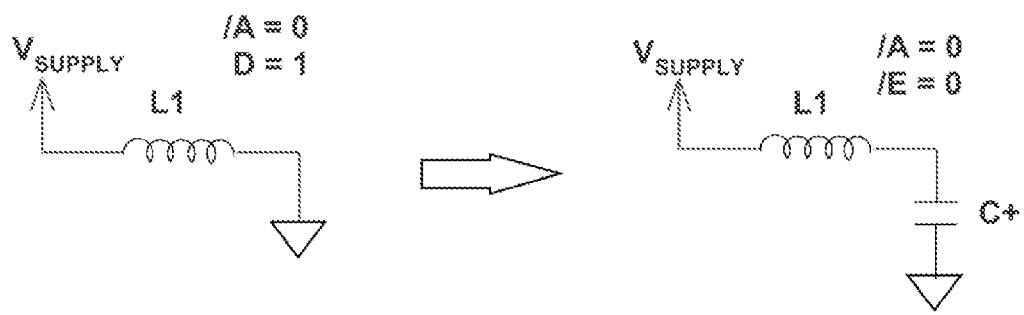
Figure 4C:
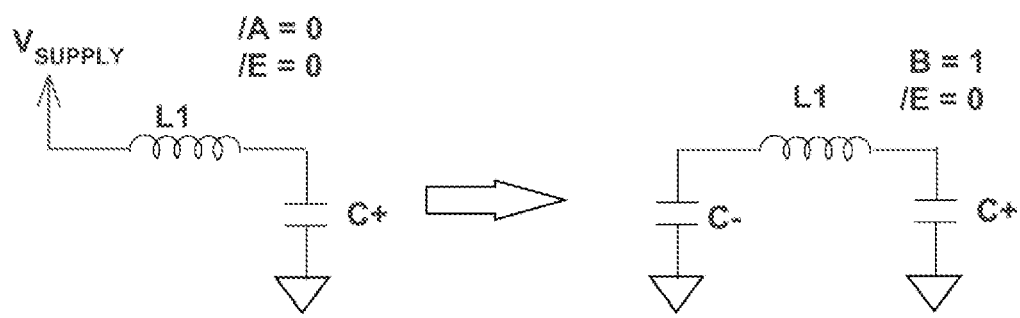
Figure 4D:
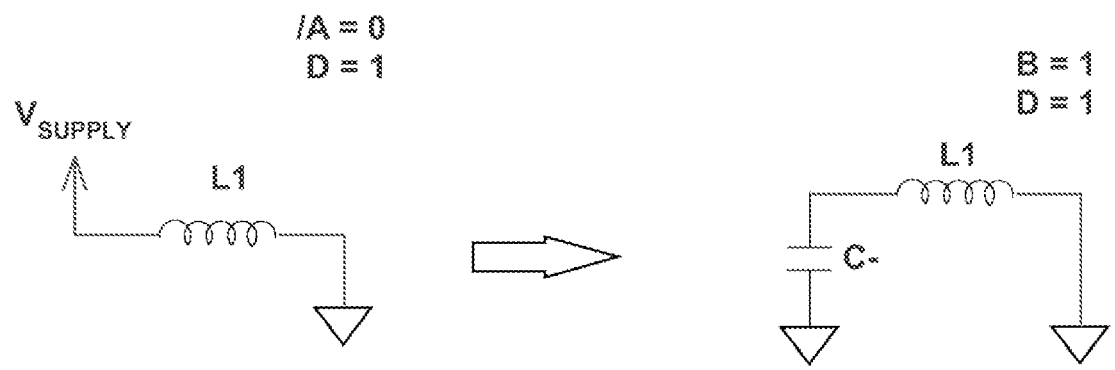

FIG. 4B shows a pair of switching cycles implementing a boost cycle that may be used to provide charge to filter capacitor C+ to increase power supply voltage $V_{DD}$, as may be performed responsive to an indication that the common mode voltage $V_{CM}$ is below a target threshold voltage. FIG. 4C shows a pair of switching cycles implementing a differential boost cycle that may be used to provide charge to filter capacitor C+ to increase power supply voltage $V_{DD}$, and to, within the same pair of cycles, as may be performed responsive to an indication that the common mode voltage $V_{CM}$ is below a target threshold voltage and that both power supply voltages $V_{DD}$, $V_{SS}$ have magnitudes lower than their target threshold voltages. FIG. 4D shows an inverting boost cycle that may be used to transfer charge from filter capacitor C− to decrease power supply voltage $V_{SS}$, as may be performed in response to an indication that common mode voltage $V_{CM}$ is above a target threshold voltage. All of the above described switching cycles shown in FIGS. 4A-4D do not require the presence of switching transistor N2.

Figure 4E:
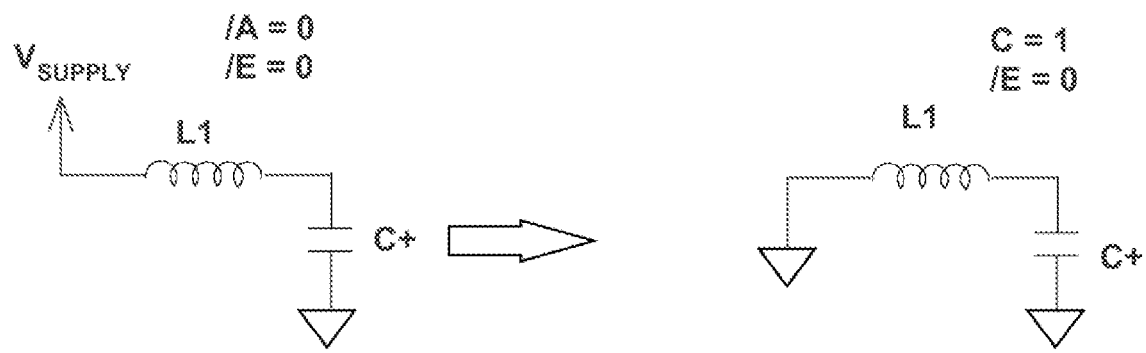
Figure 4F:
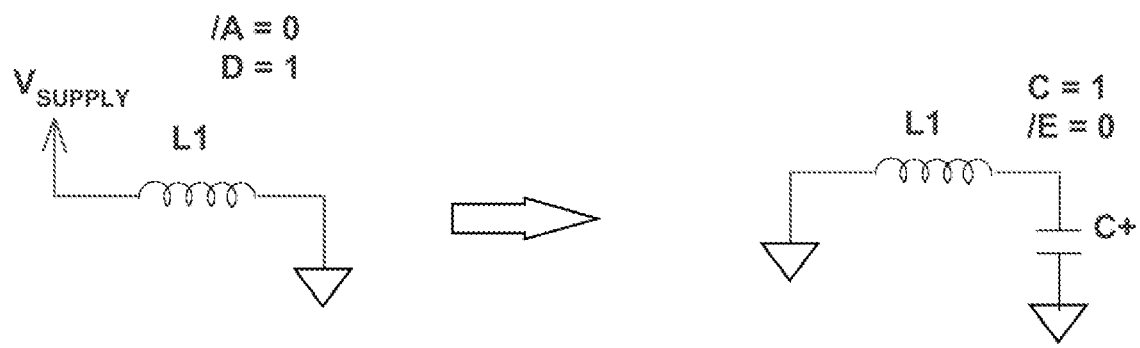

Additional switching cycles shown in FIG. 4E and FIG. 4F require the presence of switching transistor N2 and control signal C. FIG. 4E shows a pair of switching phases implementing a buck cycle that may be used to provide charge to filter capacitor C+ to increase power supply voltage $V_{DD}$, as may be performed responsive to an indication that the common mode voltage $V_{CM}$ is below a target threshold voltage. FIG. 4F shows a pair of switching cycles implementing another boost cycle that may be used to provide charge to filter capacitor C+ to increase power supply voltage $V_{DD}$, as may be performed responsive to an indication that the common mode voltage $V_{CM}$ is below a target threshold voltage. Table I below documents the operating cycles described above with reference to FIGS. 4A-4E, the state of control signals /A, B, C, D, /E, which of switching transistors P1, N1, N2, N3 and P2 are activated.

TABLE I

| | Charge phase | | Discharge phase | |
| --- | --- | --- | --- | --- |
| FIG. | Control signals asserted | Transistors Active | Control signals asserted | Transistors Active |
| FIG. 4A | /A, D | P1, N3 | B, /E | N1, P2 |
| FIG. 4B | /A, D | P1, N3 | /A, /E | P1, P2 |
| FIG. 4C | /A, /E | P1, P2 | B, /E | N1, P2 |
| FIG. 4D | /A, D | P1, N3 | B, D | N1, N3 |
| FIG. 4E | /A, /E | P1, P2 | C, /E | N2, P2 |
| FIG. 4F | /A, D | P1, N3 | C, /E | N2, P2 |

Figure 5:
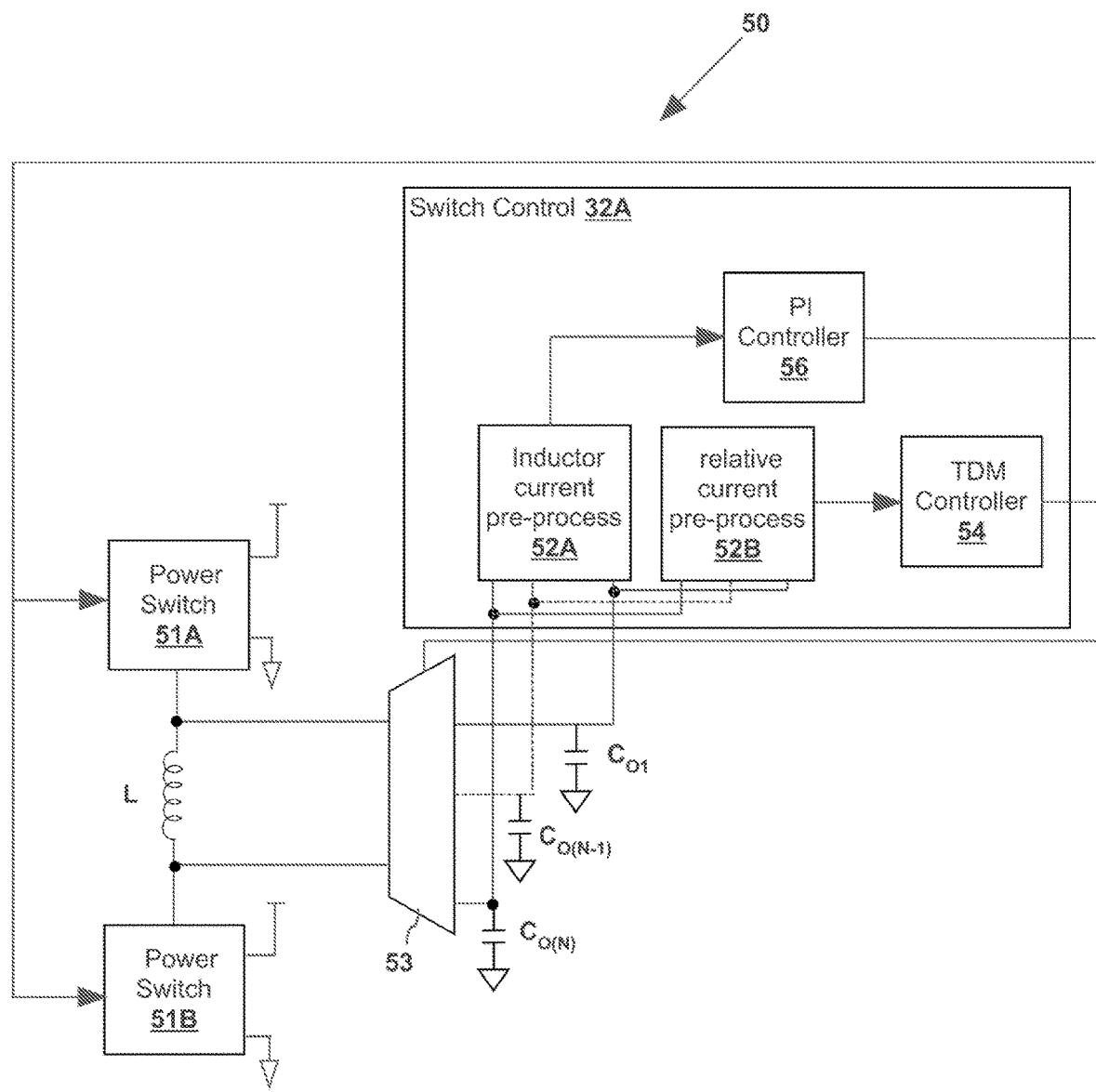
FIG. 5 is a block diagram showing an example single-inductor multiple-output (SIMO) switched-power DC-DC converter circuit 50, in accordance with an embodiment of the disclosure.

Referring now to FIG. 5, a block diagram of an example SIMO switched-power DC-DC converter circuit 50 is shown, in accordance with an embodiment of the disclosure. SIMO DC-DC converter circuit 50 is a general example of such a SIMO DC-DC converter circuit 50 with two or more output voltages filtered and held by multiple filter capacitors $C_{O1} \ldots C_{O(N-1)}$, $C_{O(N)}$. Terminals of an inductor L may be coupled to any of filter capacitors $C_{O1} \ldots C_{O(N-1)}$, $C_{O(N)}$ by controlling multiplexer 53 that provides a switching circuit. Additional switching circuits are provided by power switches 51A, 51B that couple terminals of inductor L to either ground (return terminal) or power supply voltage $V_{SUPPLY}$. A switch control block 32A measures the voltages on filter capacitors $C_{O1} \ldots C_{O(N-1)}$, $C_{O(N)}$ and operates power switches 51A, 51B and multiplexer 53 to maintain the relationship between the voltages on filter capacitors $C_{O1} \ldots C_{O(N-1)}$, $C_{O(N)}$, according to a control algorithm implemented by switch control block 32A. An inductor current pre-process block 52A determines a measure of the inductor current required to maintain all of the voltages on filter capacitors $C_{O1} \ldots C_{O(N-1)}$, $C_{O(N)}$, at the specified level and operates a proportional-integral (PI) controller 56 that controls the average inductor current through inductor L. A relative current pre-process block 52B determines whether relationships between the voltages on filter capacitors $C_{O1} \ldots C_{O(N-1)}$, $C_{O(N)}$, are within specified tolerances and a time-division multiplexing (TDM) controller 54 operates multiplexer 53 to apportion current from inductor L as between filter capacitors $C_{O1} \ldots C_{O(N-1)}$, $C_{O(N)}$ to maintain corresponding target voltages on filter capacitors $C_{O1} \ldots C_{O(N-1)}$, $C_{O(N)}$.

Figure 6:
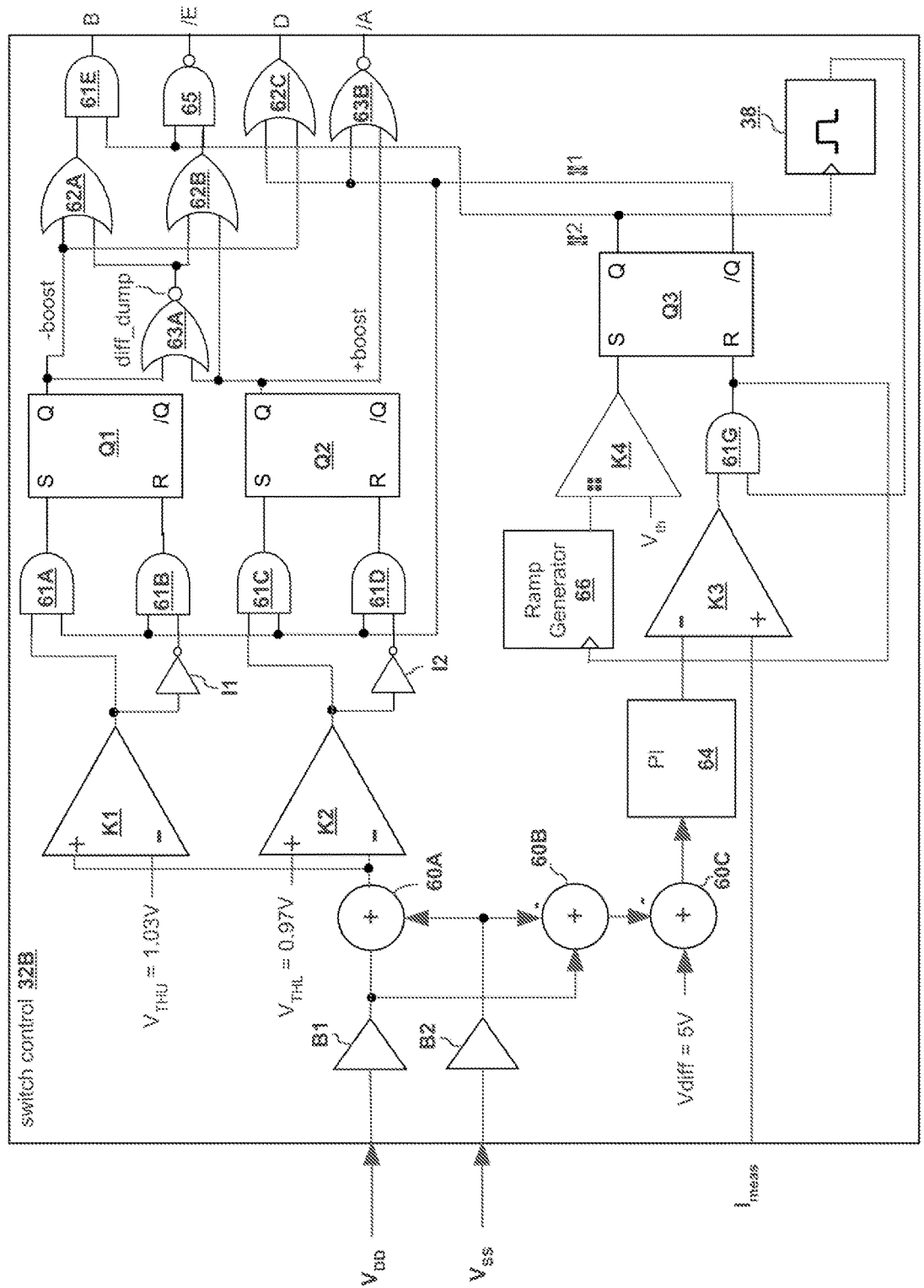
FIG. 6 is a block diagram showing an example switch control circuit 32B that may be used to implement control circuit 32 of single-inductor multiple-output (SIMO) switched-power DC-DC converter circuit 30 shown in FIG. 3A, in accordance with an embodiment of the disclosure.

Referring now to FIG. 6, a block diagram of an example switch control circuit 32B that may be used to implement control circuit 32 of single-inductor multiple-output (SIMO) switched-power DC-DC converter circuit 30 shown in FIG. 3 is shown, in accordance with an embodiment of the disclosure. Example switch control circuit 32B also represents a specific example of switch control circuit 32A that may be used in SIMO switched-power DC-DC converter circuit 50 of FIG. 5. A pair of buffers B1, B2 buffer and scale power supply voltages $V_{DD}$, $V_{SS}$ to levels suitable for further signal processing as indications of the values of power supply voltages $V_{DD}$, $V_{SS}$. The outputs of buffers B1, B2 are combined by a first combiner 60A that sums indications of the values of power supply voltages $V_{DD}$, $V_{SS}$ to provide a measure of the common-mode voltage $V_{CM}$, since $V_{CM}=(V_{DD}+V_{SS})/2$. The outputs of buffers B1, B2 are also combined by a second combiner 60B that subtracts the indication of power supply voltage $V_{SS}$ from the indication of power supply voltage $V_{DD}$ to provide a measure of the differential between power supply voltages $V_{DD}$, $V_{SS}$. The control of the relative current distribution between the two power supply outputs provided across filter capacitors C+ and C−, is determined by a TDM control loop as exemplified by TDM controller 54 in FIG. 5. The output of combiner 60A is compared to a target threshold voltage $V_{TH}$=1V, which may be scaled to accommodate any scaling applied by buffers B1, B2, and in the instant example corresponds to the condition $(V_{DD}+V_{SS})/2>0.5$V. A pair of comparators K1, K2 compare the output of combiner 60A with an upper threshold voltage $V_{THU}$=1.03V and a lower threshold voltage $V_{THL}$=0.97V, respectively. When a cycle phase Φ1 commences, as determined by logical-AND gates 61A-61D, the states of the outputs of comparators K1, K2 is transferred to the output state of set/reset flip-flops Q1 and Q2, respectively, as illustrated in Table II below.

TABLE II

| K1 | K2 | diff_dump | −boost | −boost | B | /E | D | A |
|---|---|---|---|---|---|---|---|---|
| 0 | 0 | 1 | 0 | 0 | φ2 | φ2 | φ1 | φ1 |
| 1 | 0 | 0 | 1 | 0 | φ2 | 1 | 1 | φ1 |
| 0 | 1 | 0 | 0 | 1 | 0 | φ2 | φ1 | 1 |

Inverters I1 and I2 provide the reset outputs to ensure the appropriate one of set/reset flip-flop Q1 or set/reset flip-flop Q2 is reset when the other one of flip-flop set/reset flip-flop Q1 or set/reset flip-flop Q2 is set. The start of cycle phase Φ1 causes both of a set/reset flip-flop Q1 and a set/reset flip-flop Q2 to be set if the voltage at the output of combiner 60A is within +/−300 mV of target threshold voltage $V_{TH}$, to signal that a differential dump cycle should be permitted as illustrated in FIG. 4A. (Whether or not a differential dump cycle will actually be performed is determined according to the on-time determined by inductor current measurements as described in further detail below.) If the voltage at the output of combiner 60A is greater than $V_{THU}$, only set/reset flip-flop Q1 is set, to command a negative boost cycle as illustrated in FIG. 4C. If the voltage at the output of combiner 60A is less than $V_{THL}$, only set/reset flip-flop Q2 is set, to command a positive boost cycle as illustrated in FIG. 4B.

As illustrated in Table II above, during the cycle discharge phase enabled by phase Φ2, control signal B and/or control signal /E is asserted according to the type of cycle commanded, so that charging of filter capacitor C− is selected during phase Φ2 if $V_{CM}-(V_{DD}+V_{SS})/2>0.3$V, charging of filter capacitor C+ is selected if $V_{CM}-(V_{DD}+V_{SS})/2<-0.3$V or both if $V_{CM}$ is within 300 mV of $(V_{DD}+V_{SS})/2$. The discharge phase duration control is provided by a PI control block 64 that receives the output of a combiner 60C that generates a positive output when the differential voltage indication at the output of combiner 60B is less than 5V, which is the example target differential voltage in the depicted embodiment of switched-power DC-DC converter circuit 30 of FIG. 3. The control loop implemented is either a constant-on-time valley current control or a constant-off-time peak current control as determined by how measured inductor current indication Imeas is derived. A comparator K2 compares the value of the output of PID control block 64 to measured inductor current indication Imeas to determine whether the energy transferred during discharge phase Φ2 has reached the value indicated by of the output of PID control block 64.

The control of the inductor current by PI control block 64 is performed by controlling the pulse width of discharging phase Φ2. A ramp generator 66, which is edge-retriggerable, generates a ramp that is compared to a threshold voltage $V_{th}$ by a comparator K3 to terminate a fixed-period charging phase Φ1 by setting the state of flip-flop to commence a variable-period discharge phase Φ2. A re-triggerable one-shot 38 restarts ramp generator 66 and resets flip-flop Q2 to start the next charging phase Φ1, when comparator K2 indicates that charging current is needed as determined by a logical-AND gate 61E, implementing a continuous conduction mode (CCM) or a discontinuous conduction mode (DCM) pulse-skipping mode, depending on the output of PI control block 64, if the current control employs valley current control. Otherwise, for peak current control, CCM operation must be maintained. The charging time $T_{on}$ is independent of the current control value and the inductor current and if the current control value is still greater than the inductor current at the end of charging phase Φ1, then a minimum discharge cycle length is provided in the subsequent discharge phase Φ2. PI control block 64 is slew-rate limited and the output range is also limited. The on-time of power switches 51A, 51B is related to the input voltage $V_{in}$ and the output voltages $V_+$, $V_-$ in order to maintain a pseudo-fixed frequency of operation such that:

$$T_{ON+} = \frac{V_+ - V_{in}}{V_+}T_{CYC}, T_{ON-} = \frac{V_-}{V_{in} + V_-}T_{CYC} \text{ and}$$

$$T_{OFF+} = \frac{V_{in}}{V_+}T_{CYC}, T_{OFF-} = \frac{V_{in}}{V_{in} + V_-}T_{CYC},$$

for the boost cycles and $$T_{ON\_diff} = \frac{V_+ - V_-}{V_+ - V_- + V_{in}}T_{CYC}, \text{ and } T_{OFF\_diff} = \frac{V_{in}}{V_+ - V_- + V_{in}}T_{CYC}$$

in which time $T_{CYC}$ is the full cycle period. The start time of charging phase Φ1 may be locked to a PLL clock to maintain a fixed reference interval for the start of charging phase Φ1 by synchronizing the start of ramp generator 66. A logical-OR gate 62 and a logical-NOR gate 63 activate both of control signal /A and control signal D during charging phase Φ1, and during discharging phase Φ2, maintain either control signal /A or control signal D or both, depending on the state of flip-flop Q1 and flip-flop Q2. which indicate whether charging of filter capacitor C+ or dis-charging of filter capacitor C−, or both are needed during discharging phase Φ2. If both flip-flop Q1 and flip-flop Q2 are set, a differential dump cycle as illustrated by FIG. 4A is performed. If only flip-flop Q1 is set, a negative boost cycle as illustrated by FIG. 4D is performed, and if only flip-flop Q2 is set, a positive boost cycle as illustrated by FIG. 4B is performed. Additional cycles, including all of the switching cycles depicted in FIGS. 4A-4F may be implemented by appropriate circuitry in switch control 32B according to other embodiments of the disclosure.

Figure 7A:
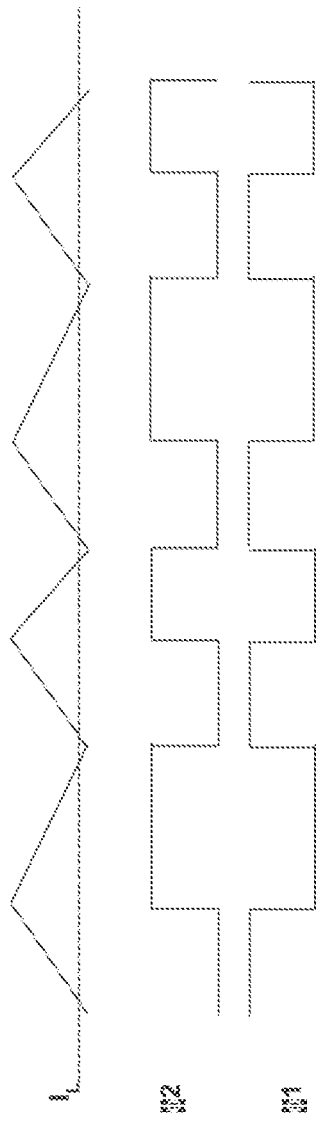
FIG. 7A and FIG. 7B are example signal waveform diagrams illustrating operation of example SIMO switched-power DC-DC converter circuit 30 of FIG. 3A, in accordance with embodiments of the disclosure.
Figure 7B:
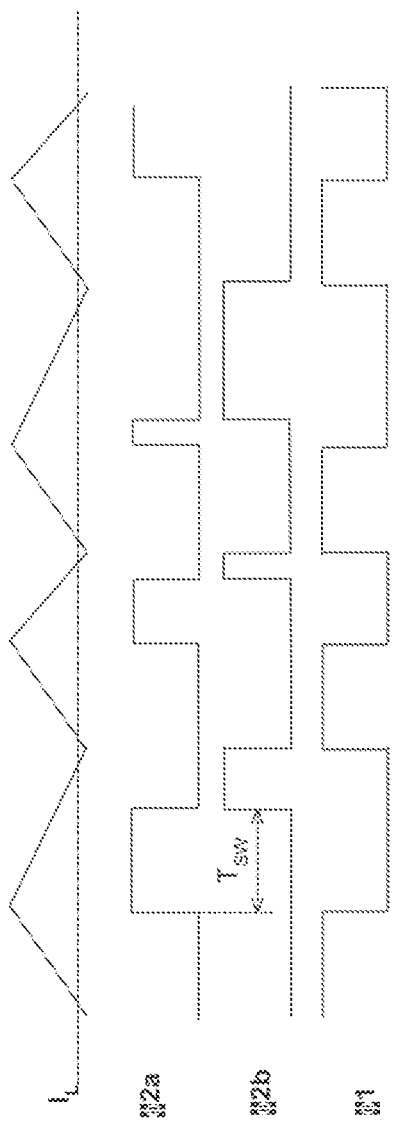

FIG. 7A and FIG. 7B are example signal waveform diagrams illustrating operation of example SIMO switched-power DC-DC converter circuit 30 of FIG. 3, in accordance with embodiments of the disclosure. FIG. 7A depicts operation according to the switching cycles described above, in which a charging phase Φ1 during which an inductor current $I_L$ increases stores energy in inductor L1 for a constant time period and a discharging phase Φ2 during which inductor current decreases to charge filter capacitor C+ or discharge filter capacitor C−, or charge filter capacitor C+ and discharge filter capacitor C− at the same time, and which terminates according to the determined energy transfer required for the cycle. FIG. 7B depicts operation according to other embodiments of the disclosure, in which, rather than alternating charging of filter capacitor C+ or discharging of filter capacitor C− at each discharging phase Φ2, the TDM control of the discharge phase energy allocation changes the relative width of a separate phase Φ2a, during, which, for example, charging of filter capacitor C+ is performed, and another phase Φ2b, during which discharging of filter capacitor C− is performed after time period $T_{SW}$ has elapsed. Since PI controller 64 in FIG. 6 is determining the total energy needed to maintain the voltage across both of filter capacitors C+, C− at their target values, the switching cycles depicted in FIG. 7B may be implemented by allowing the state of flip-flops Q1 and Q2 of FIG. 6 to change state during discharging phase Φ2 by changing the logic provided between comparators K1, K2 and set/reset flip-flops Q1, Q2 so that the outputs of comparators K1, K2 determine the duration of time period $T_{SW}$.

Figure 8A:
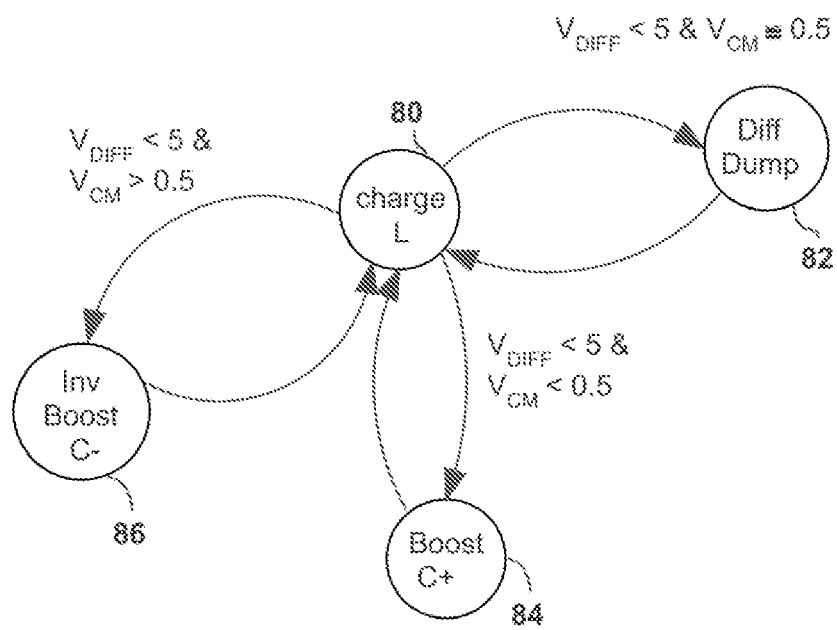
FIG. 8A and FIG. 8B are example state transition diagrams illustrating operation of example SIMO switched-power DC-DC converter circuit 30 of FIG. 3A, in accordance with embodiments of the disclosure.
Figure 8B:
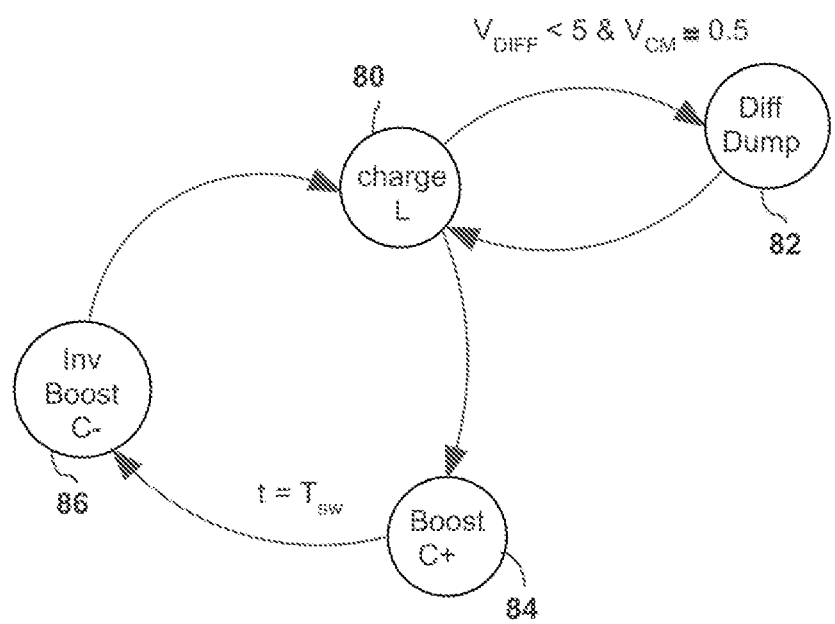

FIG. 8A and FIG. 8B are example state transition diagrams illustrating operation of example SIMO switched-power DC-DC converter circuit 30 of FIG. 3, in accordance with embodiments of the disclosure. FIG. 8A depicts the example single discharge phase Φ2 operation illustrated in FIG. 7A, in which the differential boost phase in the right side of FIG. 4A is also added to the above-described operation of example SIMO switched-power DC-DC converter circuit 30. In the example of FIG. 8A, after charging phase 80 is completed, either a differential dump phase 82 as illustrated in the right side of FIG. 4A is initiated if the differential voltage $V_{DIFF}$ between the output terminals is low, but common mode voltage $V_{CM}$ is correct, or a boost phase 84 as illustrated in the right side of FIG. 4B is initiated if common-mode voltage $V_{CM}$ is too low, or an inverting boost phase 86 as illustrated in the right side of FIG. 4D is initiated if common-mode voltage $V_{CM}$ is too high. FIG. 8B shows an example of the TDM divided individual phase Φ2a, Φ2b operation as illustrated in the example of FIG. 7B, in which, rather than returning to charging phase 80 after completing one of boost phase 84 or inverting boost phase 86, after time $t=T_{SW}$, boost phase 84 transitions to inverting boost phase 86.

In summary, this disclosure shows and describes circuits and integrated circuits having SIMO switched-power DC-DC converters and Class-D amplifiers that include the SIMO converters. The SIMO converters may provide outputs that are symmetric about a common-mode input voltage of the amplifier, while remaining asymmetric about a return terminal of the amplifier and switching converter. The SIMO converters may include an inductive element for coupling an input of the switched-power DC-DC converter circuit to a plurality of outputs of the switched-power DC-DC converter circuit and having at least one winding, a switching circuit for controlling energizing of the at least one winding of the inductive element from an input voltage source connected to the input of the switched-power DC-DC converter circuit, and a control circuit for controlling switching of the switching circuit to supply output current to each of the plurality of outputs of the switched-power DC-DC converter circuit. The control circuit may have multiple switching modes and may, in at least one of the multiple switching modes, the switching circuit may couple the inductive element between at least two of the plurality of outputs of the switched-power DC-DC converter circuit so that energy stored in the inductive element produces a differential change between corresponding voltages of the at least two of the plurality of outputs of the switched-power DC-DC converter circuit.

In some example embodiments, the switched-power DC-DC converter circuit may comprise an input terminal and a return terminal for receiving an input voltage of the switched-power DC-DC converter circuit, a pair of outputs of the DC-DC converter for providing a differential output voltage of the DC-DC converter, an inductive element for coupling the input of the switched-power DC-DC converter circuit to the pair of outputs of the switched-power DC-DC converter circuit and having at least one winding, a switching circuit for controlling energizing of the at least one winding of the inductive element from the input of the switched-power DC-DC converter circuit and transfer of energy from the at least one winding of the inductive element to the pair of outputs of the DC-DC converter, and a control circuit for controlling switching of the switching circuit to supply output current to each of the pair of outputs of the switched-power DC-DC converter circuit. The control circuit may implement a first control loop that maintains a common mode voltage of the pair of outputs of the DC-DC converter at a predetermined voltage independent of the individual voltages of the pair of outputs of the switched-power DC-DC converter.

In some example embodiments, the switched-power DC-DC converter circuit may implement a power supply for a pulse-width modulated amplifier output switching circuit, and the pair of outputs may be provided to the power supply inputs of the pulse-width modulated amplifier output switching circuit. A common-mode voltage of an input of the pulse-width modulated amplifier may be offset from the voltage of the return terminal and equal to a midpoint of a differential voltage between the pair of outputs, so that the output of the pulse-width modulated amplifier output switching circuit is symmetric about the common-mode voltage of the input of the pulse-width modulated amplifier. In some example embodiments, the first control loop may be a hysteretic time-division multiplexed control loop. In some example embodiments, the control circuit may implement a second control loop that maintains a voltage between the differential outputs by controlling an average current through the inductive element. In some example embodiments, the second control loop may be a constant-on-time valley current control loop or a constant-off-time peak current control loop. The control circuit may have multiple operating modes and in at least one of the multiple operating modes, the switching circuit may couple the inductive element between the pair of outputs of the switched-power DC-DC converter circuit so that energy stored in the inductive element produces a differential change between corresponding voltages of the pair of outputs of the switched-power DC-DC converter circuit.

In some example embodiments, the switching circuit may comprise a first switch for coupling a first terminal of the inductive element to the first input of the switched-power DC-DC converter circuit, a second switch for coupling the second terminal of the inductive element to the second input of the switched-power DC-DC converter circuit, a third switch for coupling the first terminal of the inductive element to a first one of the pair of outputs, and a fourth switch for coupling the second terminal of the inductive element to a second one of the pair of outputs. The control circuit may control the first switch, the second switch, the third switch and the fourth switch, so that when the first switch and the second switch are activated by the control circuit, the inductive element stores magnetic energy in a first charging phase, and so that when the third switch and the fourth switch are activated by the control circuit in a differential discharging phase, the stored magnetic energy provides the differential change between the corresponding voltages of the pair of outputs. In some example embodiments, the control circuit may, in response to determining that the common-mode voltage has changed in a direction of the corresponding voltage of the first one of the pair of outputs, further activate the second switch and the third switch in a second discharging phase after a repetition of the first charging phase so that the stored magnetic energy provides a common-mode correction that produces a change in the corresponding voltage of the second one of the pair of outputs. In some example embodiments, the control circuit may de-activate the second switch during a second portion of the second discharging phase and activates the fourth switch.

In some example embodiments, the switching circuit may comprise a fifth switch that couples the first terminal of the inductive element to the second input of the switched-power DC-DC converter circuit and which may be controlled by the control circuit. The control circuit may, in response to determining that the common-mode voltage has changed in a direction of the corresponding voltage of the second one of the pair of outputs, activate either the first switch and the second switch or the first switch and the fourth switch in another charging phase. The control circuit may further activate the fourth switch and the fifth switch in another discharge phase after the other charging phase to provide another common-mode correction that produces a change in the corresponding voltage of the first one of the pair of outputs. In some example embodiments, the control circuit may activate the first switch and the second switch in the other charging phase, and deactivate the fifth switch and activates the third switch a second portion of the other discharge phase. In some example embodiments, the control circuit may wherein the control circuit activate the first switch and the fourth switch in another charging phase, and may, in response to determining that the common-mode voltage has changed in a direction of the corresponding voltage of the second one of the pair of outputs, further de-activate the first switch and activate the third switch after the other charging phase to provide another common-mode correction that produces a net change in the corresponding voltage of the first one of the pair of outputs. In some example embodiments, the control circuit may, in response to determining that the common-mode voltage has changed in a direction of the corresponding voltage of the second one of the pair of outputs, further activate the first switch and the fourth switch after a repetition of the first charging phase to provide another common-mode correction that produces a change in the corresponding voltage of the first one of the pair of outputs. The control circuit may further activate the third switch and the fourth switch after a first portion of the other discharge phase during a second portion of the other discharging phase.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in a DC-DC converter for supplying circuits other than an amplifier.

What is claimed is:

1. A switched-power DC-DC converter circuit, comprising:
   an input terminal for receiving an input voltage of the switched-power DC-DC converter circuit;
   a pair of outputs of the DC-DC converter for providing a differential output voltage of the DC-DC converter;
   an inductive element for coupling the input of the switched-power DC-DC converter circuit to the pair of outputs of the switched-power DC-DC converter circuit and having at least one winding;
   a switching circuit for controlling energizing of the at least one winding of the inductive element from the input of the switched-power DC-DC converter circuit and transfer of energy from the at least one winding of the inductive element to the pair of outputs of the DC-DC converter; and
   a control circuit for controlling switching of the switching circuit to supply output current to each of the pair of outputs of the switched-power DC-DC converter circuit, wherein the control circuit implements a first control loop that maintains a common mode voltage of the pair of outputs of the DC-DC converter at a predetermined voltage independent of the individual voltages of the pair of outputs of the switched-power DC-DC converter.

2. The switched-power DC-DC converter circuit of claim 1, wherein the switched-power DC-DC converter is a power supply for a pulse-width modulated amplifier output switching circuit, wherein the pair of outputs are provided to the power supply inputs of the pulse-width modulated amplifier output switching circuit, and where a common-mode voltage of an input of the pulse-width modulated amplifier is offset from the voltage of the return terminal and equal to a midpoint of a differential voltage between the pair of outputs, so that the output of the pulse-width modulated amplifier output switching circuit is symmetric about the common-mode voltage of the input of the pulse-width modulated amplifier.

3. The switched-power DC-DC converter circuit of claim 1, wherein the first control loop is a hysteretic time-division multiplexed control loop.

4. The switched-power DC-DC converter circuit of claim 1, wherein the control circuit further implements a second control loop that maintains a voltage between the differential outputs by controlling an average current through the inductive element.

5. The switched-power DC-DC converter circuit of claim 4, wherein the second control loop is a constant-on-time valley current control loop or a constant-off-time peak current control loop.

6. The switched-power DC-DC converter of claim 1, wherein the control circuit has multiple operating modes and wherein in at least one of the multiple operating modes, the switching circuit couples the inductive element between the pair of outputs of the switched-power DC-DC converter circuit so that energy stored in the inductive element produces a differential change between corresponding voltages of the pair of outputs of the switched-power DC-DC converter circuit.

7. The switched-power DC-DC converter of claim 6, wherein the switching circuit comprises:
   a first switch for coupling a first terminal of the inductive element to the first input of the switched-power DC-DC converter circuit;
   a second switch for coupling the second terminal of the inductive element to the second input of the switched-power DC-DC converter circuit;
   a third switch for coupling the first terminal of the inductive element to a first one of the pair of outputs; and a fourth switch for coupling the second terminal of the inductive element to a second one of the pair of outputs, and wherein the control circuit controls the first switch, the second switch, the third switch and the fourth switch, so that when the first switch and the second switch are activated by the control circuit, the inductive element stores magnetic energy in a first charging phase, and so that when the third switch and the fourth switch are activated by the control circuit in a differential discharging phase, the stored magnetic energy provides the differential change between the corresponding voltages of the pair of outputs.

8. The switched-power DC-DC converter of claim 7, wherein the control circuit, in response to determining that the common-mode voltage has changed in a direction of the corresponding voltage of the first one of the pair of outputs, further activates the second switch and the third switch in a second discharging phase after a repetition of the first charging phase so that the stored magnetic energy provides a common-mode correction that produces a change in the corresponding voltage of the second one of the pair of outputs.

9. The switched-power DC-DC converter of claim 8, wherein the control circuit de-activates the second switch during a second portion of the second discharging phase and activates the fourth switch.

10. The switched-power DC-DC converter of claim 7, further comprising a fifth switch that couples the first terminal of the inductive element to the second input of the switched-power DC-DC converter circuit and is controlled by the control circuit, wherein the control circuit, in response to determining that the common-mode voltage has changed in a direction of the corresponding voltage of the second one of the pair of outputs, activates either the first switch and the second switch or the first switch and the fourth switch in another charging phase, and wherein the control circuit further activates the fourth switch and the fifth switch in another discharge phase after the other charging phase to provide another common-mode correction that produces a change in the corresponding voltage of the first one of the pair of outputs.

11. The switched-power DC-DC converter of claim 10, wherein the control circuit activates the first switch and the second switch in the another charging phase, and deactivates the fifth switch and activates the third switch a second portion of the another discharge phase.

12. The switched-power DC-DC converter of claim 7, wherein the control circuit activates the first switch and the fourth switch in another charging phase, and wherein the control circuit, in response to determining that the common-mode voltage has changed in a direction of the corresponding voltage of the second one of the pair of outputs, further de-activates the first switch and activates the third switch after the other charging phase to provide another common-mode correction that produces a net change in the corresponding voltage of the first one of the pair of outputs.

13. The switched-power DC-DC converter of claim 7, wherein the control circuit, in response to determining that the common-mode voltage has changed in a direction of the corresponding voltage of the second one of the pair of outputs, further activates the first switch and the fourth switch after a repetition of the first charging phase to provide another common-mode correction that produces a change in the corresponding voltage of the first one of the pair of outputs.

14. The switched-power DC-DC converter of claim 13, wherein the control circuit further activates the third switch and the fourth switch after a first portion of the another discharge phase during a second portion of the another discharging phase.

15. A method of operating a switched-power DC-DC converter circuit, the method comprising:
energizing an inductive element having at least one winding from an input of the switched-power DC-DC converter circuit, wherein a first input of the switched-power DC-DC converter circuit receives an input DC power supply voltage, wherein a second input of the switched-power DC-DC converter circuit is coupled to a return terminal corresponding to the input DC power supply voltage;
transferring energy stored in the inductive element to a pair of outputs of the switched-power DC-DC converter circuit; and
implementing a first control loop that maintains a common mode voltage of the pair of outputs at a predetermined voltage independent of the individual voltages of the pair of outputs of the switched-power DC-DC converter.

16. The method of claim 15, wherein the switched-power DC-DC converter is a power supply for a pulse-width modulated amplifier output switching circuit, wherein the pair of outputs are provided to the power supply inputs of the pulse-width modulated amplifier output switching circuit, and where a common-mode voltage of an input of the pulse-width modulated amplifier is offset from the voltage of the return terminal and equal to a midpoint of the differential voltage, so that the output of the pulse-width modulated amplifier output switching circuit is symmetric about the common-mode voltage of the input of the pulse-width modulated amplifier.

17. The method of claim 15, wherein the first control loop is a hysteretic time-division multiplexed control loop.

18. The method of claim 15, further comprising implementing a second control loop that maintains the differential voltage by controlling an average current through the inductive element.

19. The method of claim 18, wherein the first control loop is a constant-on-time valley current control loop or a constant-off-time peak current control loop.

20. The method of claim 15, wherein the transferring the energy is performed according to multiple operating modes, and wherein in at least one of the multiple operating modes, the inductive element is coupled between the pair of outputs of the switched-power DC-DC converter circuit so that energy stored in the inductive element produces a differential change between corresponding voltages of the pair of outputs of the switched-power DC-DC converter circuit.

21. The method of claim 20, wherein the energizing is performed by a first switch for coupling a first terminal of the inductive element to the first input of the switched-power DC-DC converter circuit and a second switch for coupling the second terminal of the inductive element to the second input of the switched-power DC-DC converter circuit, and wherein the transferring energy is performed by a third switch for coupling the first terminal of the inductive element to a first one of the pair of outputs, and fourth switch for coupling the second terminal of the inductive element to a second one of the pair of outputs, so that when the first switch and the second switch are activated, the inductive element stores magnetic energy in a first charging phase, and so that when the third switch and the fourth switch are activated by the control circuit in a differential discharging phase, the stored magnetic energy provides the differential change between the corresponding voltages of the pair of outputs.

22. The method of claim 21, further comprising determining that the common-mode voltage has changed in a direction of the corresponding voltage of the first one of the pair of outputs, and wherein the transferring energy further activates the second switch and the third switch in a second discharging phase after a repetition of the first charging phase so that the stored magnetic energy provides a common-mode correction that produces a change in the corresponding voltage of the second one of the pair of outputs.

23. The method of claim 22, further comprising de-activating the second switch during a second portion of the second discharging phase and activating the fourth switch.

24. The method of claim 21, further comprising:
coupling the first terminal of the inductive element to the second input of the switched-power DC-DC converter circuit with a fifth switch;
in response to determining that the common-mode voltage has changed in a direction of the corresponding voltage of the second one of the pair of outputs, activating either the first switch and the second switch or the first switch and the fourth switch in another charging phase; and
activating the fourth switch and the fifth switch in another discharge phase after the other charging phase to provide another common-mode correction that produces a change in the corresponding voltage of the first one of the pair of outputs.

25. The method of claim 24, wherein the first switch and the second switch are activated in the another charging phase, and further comprising deactivating the fifth switch and activates the third switch in a second portion of the another discharge phase.

26. The method of claim 21, further comprising:
activating the first switch and the fourth switch in another charging phase; and
in response to determining that the common-mode voltage has changed in a direction of the corresponding voltage of the second one of the pair of outputs, de-activating the first switch and activating the third switch after the other charging phase to provide another common-mode correction that produces a net change in the corresponding voltage of the first one of the pair of outputs.

27. The method of claim 21, further comprising, in response to determining that the common-mode voltage has changed in a direction of the corresponding voltage of the second one of the pair of outputs, activating the first switch and the fourth switch after a repetition of the first charging phase to provide another common-mode correction that produces a change in the corresponding voltage of the first one of the pair of outputs.

28. The method of claim 27, further comprising activating the third switch and the fourth switch after a first portion of the another discharge phase during a second portion of the another discharging phase.

* * * * *

UNITED STATES PATENT AND TRADEMARK OFFICE
CERTIFICATE OF CORRECTION

PATENT NO. : 11,552,567 B2
APPLICATION NO. : 17/218992
DATED : January 10, 2023
INVENTOR(S) : Zhao et al.

It is certified that error appears in the above-identified patent and that said Letters Patent is hereby corrected as shown below:

In the Specification

In Column 6, Line 15, delete "current a" and insert -- a current --, therefor.

In Column 6, Line 18, delete "Ictl." and insert -- $I_{CTL}$. --, therefor.

In Column 6, Line 64, delete "used various" and insert -- used for various --, therefor.

In Column 9, Line 59, delete "Imeas" and insert -- $I_{meas}$ --, therefor.

In Column 9, Line 61, delete "Imeas" and insert -- $I_{meas}$ --, therefor.

In Column 9, Line 63, delete "by of" and insert -- by --, therefor.

In Column 10, Line 64, delete "$\Phi_2$" and insert -- Φ2 --, therefor.

Signed and Sealed this
Seventh Day of March, 2023

Katherine Kelly Vidal
*Director of the United States Patent and Trademark Office*